United States Patent [19]
Biglin
[11] 4,267,505
[45] May 12, 1981

[54] FAILURE SENSOR FOR A GAS DETECTOR

[75] Inventor: Timothy J. Biglin, Brislington, England

[73] Assignee: The Horstmann Gear Company Limited, Newbridge Works, England

[21] Appl. No.: 931,963

[22] Filed: Aug. 8, 1978

[30] Foreign Application Priority Data

Aug. 11, 1977 [GB] United Kingdom ............... 33810/77

[51] Int. Cl.[3] ....................... G01R 31/08; G01R 27/02

[52] U.S. Cl. .................................... 324/65 R; 324/52; 324/71 SN; 340/634

[58] Field of Search .................. 324/65 R, 71 SN, 52; 340/634; 330/69; 23/232 E; 73/27 R

[56] References Cited

U.S. PATENT DOCUMENTS 3,573,647 4/1971 Antoniou .............................. 330/69
4,007,456 2/1977 Paige et al. .......................... 340/634

*Primary Examiner*—Ernest F. Karlsen
*Attorney, Agent, or Firm*—Emory L. Groff, Jr.

[57] ABSTRACT

A failure sensor for a gas detector comprises a direct current amplifier having a feed-back path between its output and its input. The feed-back path includes a negative feed-back circuit. A connection is provided in the feed-back path for connection to a gas detector and is arranged to influence the feed-back factor. There is also provided a sensor for sensing differential voltage between the connection and the feed-back path and the output of the amplifier and for providing an output signal indicative of a fault condition where a predetermined differential value occurs.

9 Claims, 3 Drawing Figures

FAILURE SENSOR FOR A GAS DETECTOR

BACKGROUND OF THE INVENTION

This invention relates to a failure sensor for a gas detector, for example a Taguchi gas detector.

Gas detectors of the Taguchi type employ a semiconductor element which is heated by an electrical heater coil. At a critical temperature the semiconductor element has a resistance characteristic which exhibits a large change of resistance in the presence of a gas. The resistance of this element falls in value in the presence of gas. The most likely fault condition to arise is (1) failure of the heater, in which case the semiconductor element exhibits a very high resistance; or (2) an open circuit failure of the semiconductor element, which again means that the semiconductor element appears to have a very high resistance.

SUMMARY OF THE INVENTION

The present invention seeks to provide a failure sensor which will detect either one of the above mentioned faults.

According to the invention there is provided a failure sensor for a gas detector comprising a direct current amplifier having an input and an output, a feed-back path between said input and said output and including a negative feed-back circuit, a connection in said feed-back path for connection to a gas detector and arranged to influence the feed-back factor, and means for sensing differential voltage between said connection and said output of the amplifier and for providing an output signal indicative of a fault condition when a predetermined differential value occurs.

The means for sensing differential voltage may be arranged to provide the output signal when the differential voltage is substantially zero. The voltages at the output of the amplifier and at the connection in the feed-back path are preferably fed via respective voltage dividers to a comparator. The divider ratios may be arranged to be different such that the relevant polarities between divider outputs are reversed under said fault conditions.

In order that the invention and its various other preferred features may be understood more easily, two embodiments thereof will now be described, by way of example only, with reference to the drawings, in which:

DESCRIPTION OF THE PREFERRED EMBODIMENTS

Figure 1:
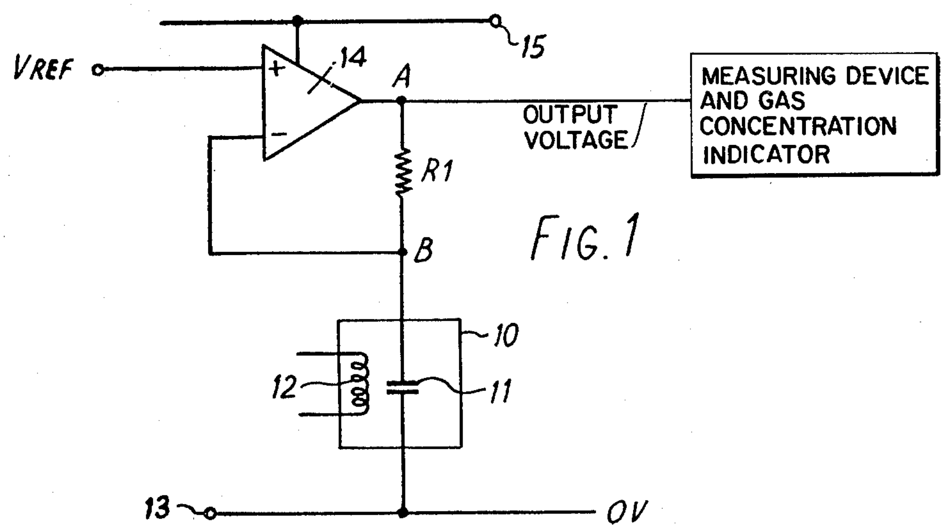
FIG. 1 is a circuit diagram of a basic circuit arranged in accordance with the invention.

The circuit of FIG. 1 shows a gas detector 10 of the Taguchi type having a semiconductor element 11 and a heater coil 12 which is fed from a supply source. One side of the semiconductor element 11 is connected to one side 13 of a source of supply potential which may be earthed. The other side of the semiconductor element 11 is coupled to a connection B in the feed-back path of a negative feed-back amplifier. In this particular case the connection B is connected directly to the inverting input of a direct current differential amplifier 14 and via a resistor R1 to a connection A at the output of the differential amplifier 14. The non-inverting input of the amplifier 14 is connected to a reference voltage source. The value of the resistor R1 is chosen such that under normal operating conditions of the gas detector, that is when it has a predetermined resistance value, the feed-back factor is such as to provide an ouput voltage from the amplifier at A which is higher than the voltage occurring at B. In the event of failure of the gas detector resulting in the resistance of the semiconductor element 11 increasing to a higher value the feed-back factor for the amplifier 14 is increased and the voltage at A falls to that of B. By comparing the voltages at A and B it is possible to determine when failure has occurred. Any suitable means for comparing these two voltages and for providing an indication when the differential value reaches a certain level can be employed to provide an indication of failure.

Figure 2:
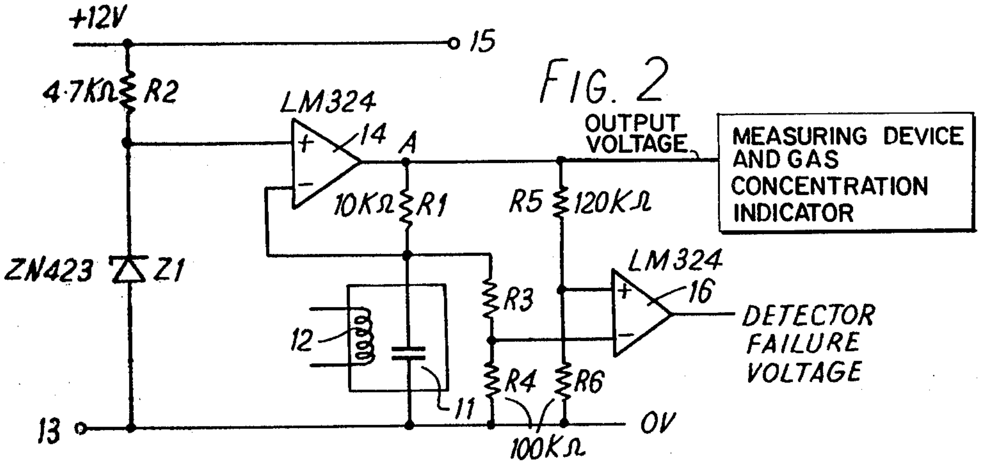
FIG. 2 is a practical circuit diagram showing the arrangement of FIG. 1 used with a voltage comparator for providing an output signal indicative of failure of the gas detector.

The practical circuit of FIG. 2 shows component values for the basic circuit of FIG. 1 and also for a voltage comparator circuit. The reference voltage for the non-inverting input of the amplifier 14 is provided by means of a series circuit formed by a resistor R2 and a zener diode Z1 coupled between opposite sides of a source of supply voltage. The junction of the resistor and the zener diode is taken directly to the non-inverting input. The connection B is taken via a voltage divider circuit formed by the series connections of resistors R3 and R4 to the reference side 13 of the source supply potential. The junction of the resistors R3 and R4 are taken to the inverting input of a second differential amplifier 16. The output of the amplifier 14 is taken via a voltage divider formed by the series connection of resistors R5 and R6 to the reference side 13 of the source of supply potential. The junction between resistors R5 and R6 is coupled to the non-inverting input of amplifier 16. As will be seen from the values given the divider ratio provided by R5 and R6 is greater than that provided by R3 and R4. The ratios are chosen such that the differential voltage occurring between the inverting and non-inverting inputs of the amplifier 16 change sign as the voltage at point A approaches the voltage at point B. This change of sign can be arranged to trip the amplifier 16 between a low and a high voltage output condition the higher voltage indicating a failure of the detector and being suitable for operating or triggering any form of alarm device.

Figure 3:
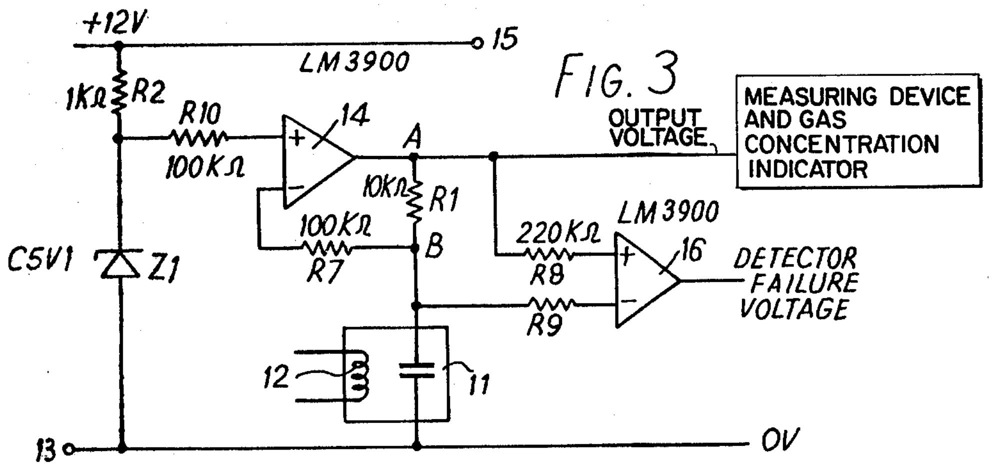
FIG. 3 is a circuit diagram of another practical arrangement this time employing a current comparator for providing an output signal indicative of failure of the gas detector.

An alternative arrangement employing a current comparator is shown in FIG. 3 in this arrangement an additional resistor R7 is provided in the feed-back path between the connection B and the inverting input of the amplifier 14. The non-inverting input is coupled to the reference voltage source via a resistor R10. The point A is coupled to the non-inverting input of an amplifier 16 via a resistor R8 and the point B is coupled to the inverting input of the amplifier 16 via a resistor R9. The resistors R8 and R9 are of high value with R9 being larger than R8 and the resistors act as current restricting elements which cause an effective change in relative polarities at the inverting and non-inverting inputs of the amplifier 16 as the voltage at point A approaches the voltage at point B. Again the amplifier 16 can be arranged to be triggered between a low voltage output condition and a high voltage output condition when A approaches the voltage at B to provide an indication of a failure.

It will be appreciated that any means for comparing the differential voltage between the points A and B and for providing an indication when their voltages are substantially equal could be employed to operate an alarm system in place of the systems disclosed in FIGS. 2 and 3.

The output from the point A can be coupled directly or indirectly to a voltage measuring device and this voltage measuring device may be calibrated directly in terms of gas concentration detected.

The voltage at the point A under normal working conditions is between 1.3 and 1.4 volts whilst the voltage at point B remains constant at 1.2 volts. Under fault conditions the voltage at A falls to approximately 1.2 volts.

The only other fault condition likely to occur with gas detectors of this type is a short circuit of the semiconductor element 11. The present circuit does not detect this fault but conventional alarm facilities are well known and are normally provided in detectors of this type.

What is claimed is:

1. A gas detector combined with means for sensing failure of the detector comprising a direct current amplifier having an input and an output, at least one resistor connected between the input and the output to form a feed back path with a negative feed back factor, the gas detector being electrically connected between a reference potential and a point in the feed back path between the resistor and the input to the amplifier, there being in use a difference between the voltage at said point in the feed back path and the voltage at the output of the amplifier, first and second voltage dividers, the first voltage divider being connected between said point in the feed back path and the reference potential and the second voltage divider being connected between the output of the amplifier and the reference potential, and comparator means for sensing a value indicative of said voltage difference for providing an output signal indicative of failure of the detector when a predetermined voltage difference occurs, the voltage at said point in the feed back path and the voltage at the output of the amplifier being fed to said comparator means by respective ones of said voltage dividers.

2. A gas detector in accordance with claim 1, wherein said means for sensing said voltage difference is arranged to provide said output signal when said voltage difference is substantially zero.

3. A gas detector in accordance with claim 1, wherein said direct current amplifier comprises a differential amplifier having first and second differential inputs, said first differential input being coupled to said feed-back path and wherein there is further provided a reference voltage source coupled to said second differential input of the differential amplifier.

4. A gas detector in accordance with claim 1 wherein said means for sensing said voltage difference comprises a differential amplifier having a first input coupled to said point in the feed-back path and a second input coupled to the output of the direct current amplifier.

5. A gas detector in accordance with claim 1 comprising a semiconductor element for detecting the presence of gas the semiconductor element being heated by an electrical heater coil.

6. A gas detector in accordance with claim 1 including a voltage responsive measuring device coupled to the output of the direct current amplifier and effective to provide an indication of gas concentration.

7. A gas detector in accordance with claim 1, wherein the divider ratio of one of said voltage dividers is greater than the divider ratio of the other of said voltage dividers, the ratios being chosen such that the relevant polarities between divider outputs are reversed upon a failure of the detector.

8. A gas detector combined with means for sensing failure of the detector comprising a first amplifier having a non-inverting input, an inverting input and an output, the non-inverting input being connected to a first reference voltage source, a first resistor, the output of the amplifier being connected to a first end of the first resistor and the inverting input of the amplifier being connected to the second end of the first resistor, the gas detector being connected between the second end of the first resistor and a second reference voltage source, second and third resistors connected in series between the second end of the first resistor and the second reference voltage source, fourth and fifth resistors connected in series between the output of the amplifier and the second reference voltage source, and a second amplifier having an inverting input, a non-inverting input and an output, the point of connection between the second and third resistors being connected to the inverting input of the second amplifier, and the point of connection between the fourth and fifth resistors being connected to the non-inverting input of the second amplifier, whereby upon failure of the gas detector a signal indicative of the failure is obtained at the output of the second amplifier.

9. A gas detector combined with means for sensing failure of the detector comprising a first amplifier having a non-inverting input, an inverting input and an output, the non-inverting input being connected to a first reference voltage source, a first resistor, the output of the amplifier being connected to a first end of the first resistor, a second resistor, the second resistor being connected between the second end of the first resistor and the inverting input of the amplifier, the gas detector being connected between the second end of the first resistor and a second reference voltage source, a second amplifier having a non-inverting input, an inverting input and an output, a third resistor being connected between the output of the first amplifier and the non-inverting input of the second amplifier, and a fourth resistor connected between the second end of the first resistor and the inverting input of the second amplifier, whereby upon failure of the gas detector a signal indicative of the failure is obtained at the output of the second amplifier.

* * * * *